(12) United States Patent
Glaser et al.

(10) Patent No.: US 10,931,244 B2
(45) Date of Patent: Feb. 23, 2021

(54) COMMON GATE AMPLIFIER WITH HIGH ISOLATION FROM OUTPUT TO INPUT

(71) Applicant: Efficient Power Conversion Corporation, El Segundo, CA (US)

(72) Inventors: John S. Glaser, Niskayuna, NY (US); Michael A. de Rooij, Playa Vista, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 16/451,270

(22) Filed: Jun. 25, 2019

(65) Prior Publication Data
US 2019/0393846 A1 Dec. 26, 2019

Related U.S. Application Data

(60) Provisional application No. 62/690,106, filed on Jun. 26, 2018.

(51) Int. Cl.
*H03F 3/16* (2006.01)
*H01L 29/20* (2006.01)
*H01L 27/088* (2006.01)

(52) U.S. Cl.
CPC ............. *H03F 3/16* (2013.01); *H01L 27/088* (2013.01); *H01L 29/2003* (2013.01); *H03F 2200/72* (2013.01)

(58) Field of Classification Search
CPC .............. H03F 3/04; H03F 3/16; H03F 3/68
USPC ..................................... 330/277, 296, 310
See application file for complete search history.

(56) References Cited

U.S. PATENT DOCUMENTS

| | | | |
|---|---|---|---|
| 9,484,862 B2 | 11/2016 | de Rooij et al. | |
| 2010/0148873 A1* | 6/2010 | Li | H03F 1/3205 330/277 |
| 2010/0271135 A1* | 10/2010 | Afsahi | H03F 1/52 330/296 |
| 2018/0026585 A1* | 1/2018 | Ali | H03F 3/195 330/290 |

* cited by examiner

*Primary Examiner* — Steven J Mottola
(74) *Attorney, Agent, or Firm* — Blank Rome LLP (57) ABSTRACT

A common gate amplifier circuit configured to provide decreased voltage transients in the input voltage due to reverse gain. A second FET transistor is connected in series with a first FET of the common gate amplifier to function as an additional capacitive voltage divider between the amplifier output and the amplifier input without influencing the input or output currents. The first FET transistor, coupled to the amplifier input, may be a low voltage FET and smaller than the second FET transistor, which is coupled to the amplifier output. Both FET transistors are preferably enhancement mode GaN FET transistors and may be integrated into a single semiconductor chip with a single internal bias voltage divider.

6 Claims, 8 Drawing Sheets

COMMON GATE AMPLIFIER WITH HIGH ISOLATION FROM OUTPUT TO INPUT

This application claims the benefit of U.S. Provisional Application No. 62/690,106, filed on Jun. 26, 2018, the entire disclosure of which is hereby incorporated by reference.

BACKGROUND

1. Field of the Invention

The present invention relates generally to common gate amplifiers, and, more particularly to a common gate amplifier with high reverse voltage attenuation, also known as low reverse gain, or high isolation from output to input, to reduce voltage gain from output to input.

2. Description of the Related Art

Figure 1:
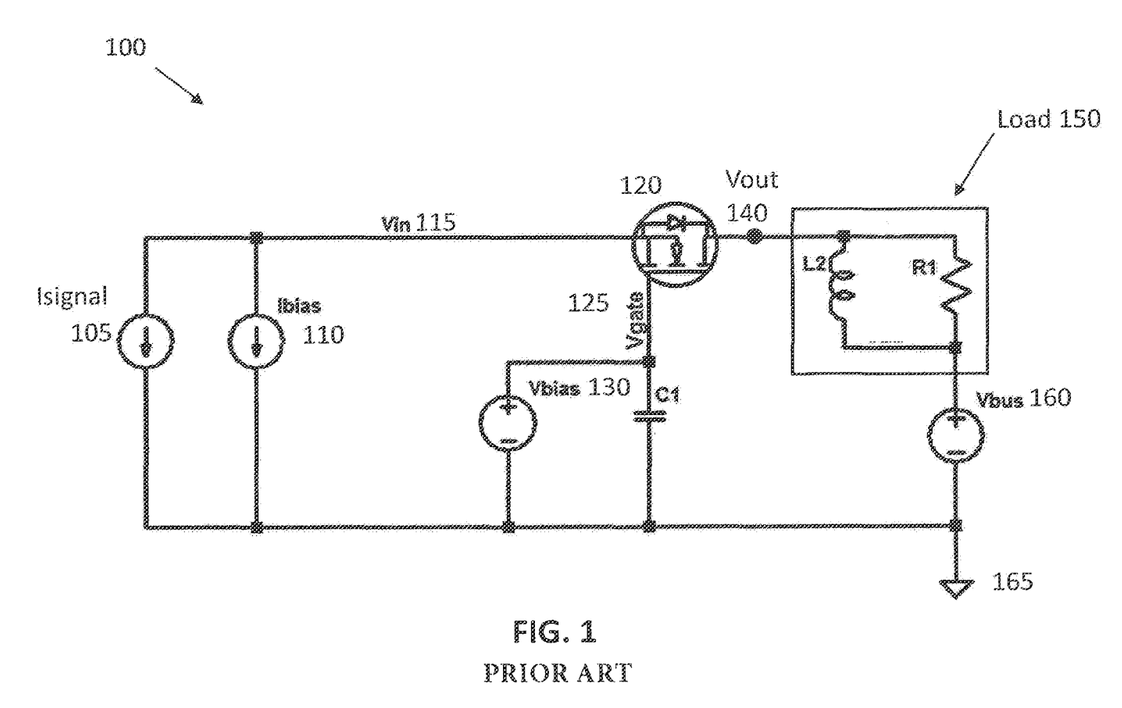
FIG. 1 illustrates a common gate amplifier with a single GaN FET transistor driven by a current source.

FIG. 1 illustrates a schematic of a common gate amplifier 100 driven by a current source. As shown, conventional common gate amplifier 100 includes a signal current source 105, a biasing current source 110, a transistor 120, a bias voltage source 130, and a bus voltage source 160. In the circuit of FIG. 1, transistor 120 is an enhancement mode gallium nitride (GaN) field effect transistor (FET) semiconductor device, although other types of FETs may be used in other implementations.

A GaN FET transistor includes a nitride semiconductor with at least two nitride layers. Different materials formed on the semiconductor or on a buffer layer cause the layers to have different band gaps. The different material in the adjacent nitride layers also causes polarization, which contributes to a conductive two dimensional electron gap (2DEG) region near the junction of the two layers, specifically in the layer with the narrower band gap. If the 2DEG region is depleted, i.e. removed, below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

Signal current source input 105 is coupled to common node 165 and to a source terminal of transistor 120, and generates a current Isignal. DC biasing current source 110 is coupled to common node 165 and to the source terminal of GaN FET transistor 120, and generates a DC current Ibias. The voltage at the source terminal of GaN FET transistor 120 is labeled Vin 115. The gate terminal of GaN FET transistor 120 is coupled to DC bias voltage source 130 and to a capacitor C1, which cause a DC voltage on the gate terminal of transistor 120, labeled as Vgate 125. The gate terminal is connected to AC ground by capacitor C1, the capacitance of which is chosen to present a negligible AC impedance at any frequency of interest.

The drain terminal of GaN FET transistor 120 is coupled to a load 150, which is further coupled to bus voltage source 160. Load 150 may be any appropriate load for a common gate amplifier, and is schematically represented in this example by an inductor L2 and a resistor R1. The voltage on the drain terminal of GaN FET transistor 120 is labeled Vout 140, and corresponds to the current output from conventional common gate amplifier 100 multiplied by the output impedance. Because the output current of a common gate amplifier is substantially equal to the input current, Vout 140 also corresponds to the input current multiplied by the output impedance.

Common gate amplifiers such as conventional common gate amplifier 100 have a low input impedance, a high output impedance, and a current gain of approximately one. Because they avoid Miller multiplication of the gate to drain capacitance (Cgd) of transistors, common gate amplifiers are often used in implementations requiring high gain-bandwidth product. Common gate amplifiers are also used in implementations requiring a low amplifier input impedance, such as in implementations where the driving source is itself of a high impedance, e.g. a current source. Common gate amplifiers also serve as current "buffers", outputting substantially the same current input to it without gain or inversion.

However, when driven by a high impedance source, such as a current source, variations in the output voltage Vout are reflected in the input voltage Vin, due to the capacitive voltage divider formed by the drain to source capacitance (Cds) and gate to source capacitance (Cgs) of transistors in the common gate amplifiers. The variations in Vin due to Vout may be large enough to damage or disrupt the operation of the common gate amplifier or connected circuits, such as the circuit comprising the input current source Isignal 105.

Figure 2:
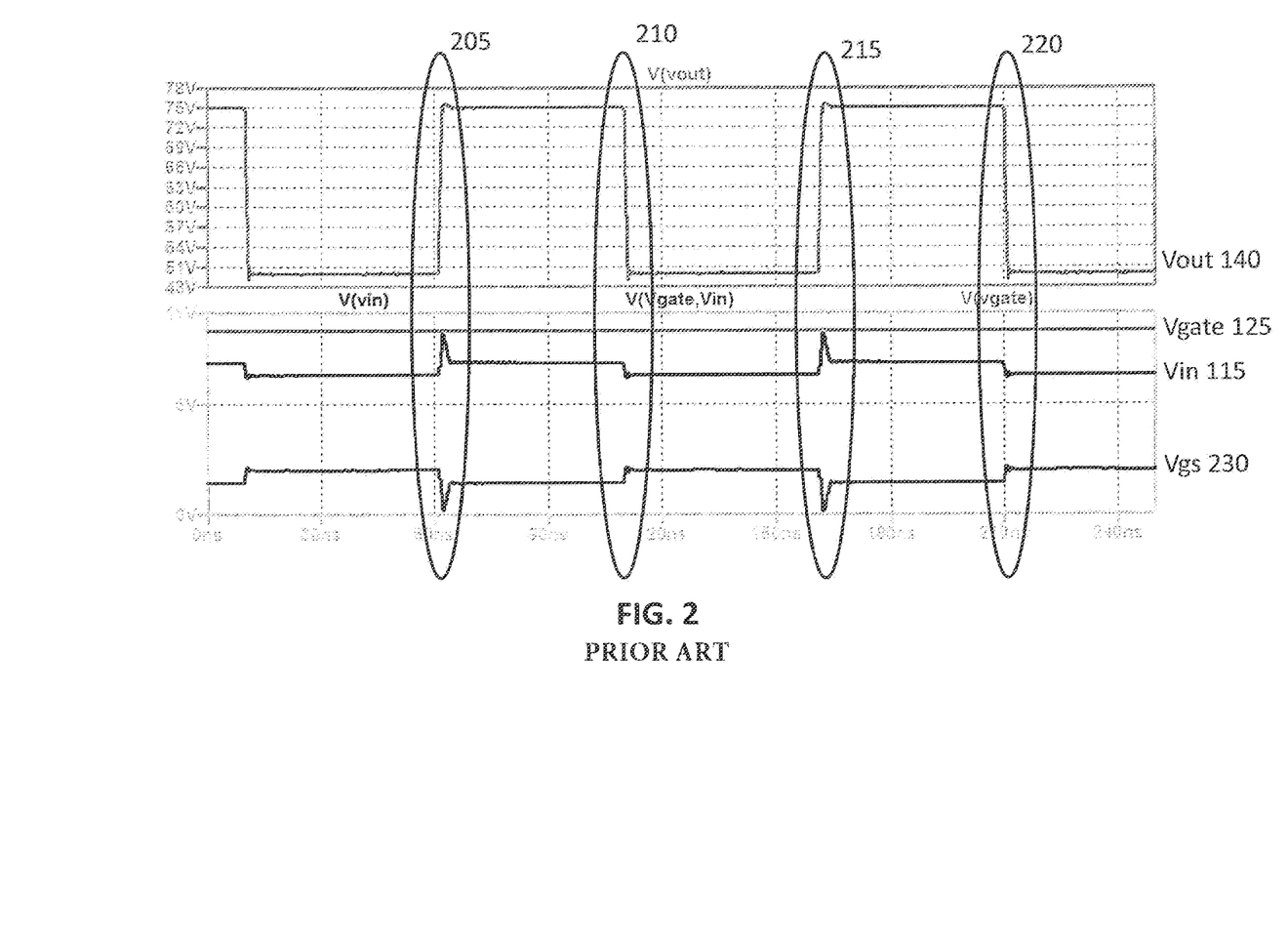
FIG. 2 illustrates a graph of input voltage, gate voltage, and output voltage for the common gate amplifier of FIG. 1.

FIG. 2 illustrates a graph of input voltage Vin 115, gate voltage Vgate 125, and output voltage Vout 140 for the common gate amplifier 100 shown in FIG. 1, when the input current signal Isignal is a current pulse of approximately rectangular shape. As may be seen at 205, 210, 215, and 220, a voltage transient portion of Vout 140 is attenuated through the capacitive voltage divider in GaN FET transistor 120 to Vin 115. Sufficiently large voltage transients may cause the gate to source voltage (Vgs 230) of transistor 120 to decrease below the threshold voltage, which in turn may cause GaN FET transistor 120 to leave the saturation region and turn off. As discussed previously herein, very large voltage transients may damage or disrupt operation of transistor 120 or circuits coupled to node Vin, including the input current sources Isignal 105 and Ibias 110.

Figure 3:
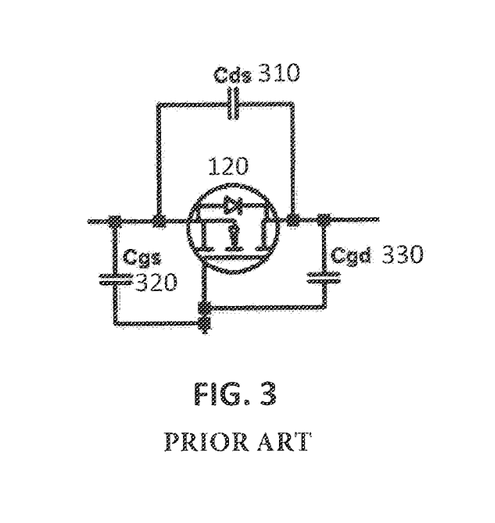
FIG. 3 illustrates the parasitic capacitance of a typical GaN FET transistor.

FIG. 3 illustrates the parasitic capacitance of GaN FET transistor 120 shown in FIG. 1. The drain to source capacitance (Cds) of GaN FET transistor 120 is labeled as Cds 310. The gate to source capacitance (Cgs) of GaN FET transistor 120 is labeled as Cgs 320. The gate to drain capacitance (Cgd) of GaN FET transistor 120 is labeled as Cgd 330. The relationship between input voltage Vin 115 and output voltage Vout 140 is represented as:

$$Vin = \frac{Cds}{Cgs + Cds} Vout$$

Cgd 330 has substantially no contribution to the voltage divider effect of parasitic capacitances in GaN FET transistor 120, because Vgate 125 is set to AC ground. While all FET transistors experience some parasitic capacitance and thus act as capacitive voltage dividers, some types of FETs have larger or smaller parasitic capacitances than others, and experience different reverse gain. As discussed previously herein with reference to FIG. 2, a FET transistor, such as a GaN FET, with a sufficiently large reverse gain may disadvantageously cause voltage transients large enough to decrease its gate to source voltage below the threshold voltage and turn off.

SUMMARY OF THE INVENTION

The present invention addresses the disadvantages of using a GaN FET transistor in a common mode amplifier discussed above, by providing a circuit with decreased voltage transients in the input voltage due to reverse gain in the common gate amplifier. The present invention, as described herein, comprises a second GaN FET transistor coupled in series with the GaN FET transistor in the common gate amplifier, configured to function as an additional capacitive voltage divider between the amplifier output and the amplifier input without influencing the input or output currents. The first GaN FET transistor, coupled to the amplifier input, may be a low voltage GaN FET and smaller than the second GaN FET transistor, which is coupled to the amplifier output. Both GaN FET transistors are preferably enhancement mode GaN FETs and may be integrated into a single semiconductor chip. Preferably, an internal bias voltage divider circuit is provided to generate different bias voltages for the GaN FET transistors from a single voltage source.

In a further embodiment, the common gate amplifier further comprises a third GaN FET transistor coupled in series with the first and second GaN FET transistors, and configured to function as a further capacitive voltage divider.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 4:
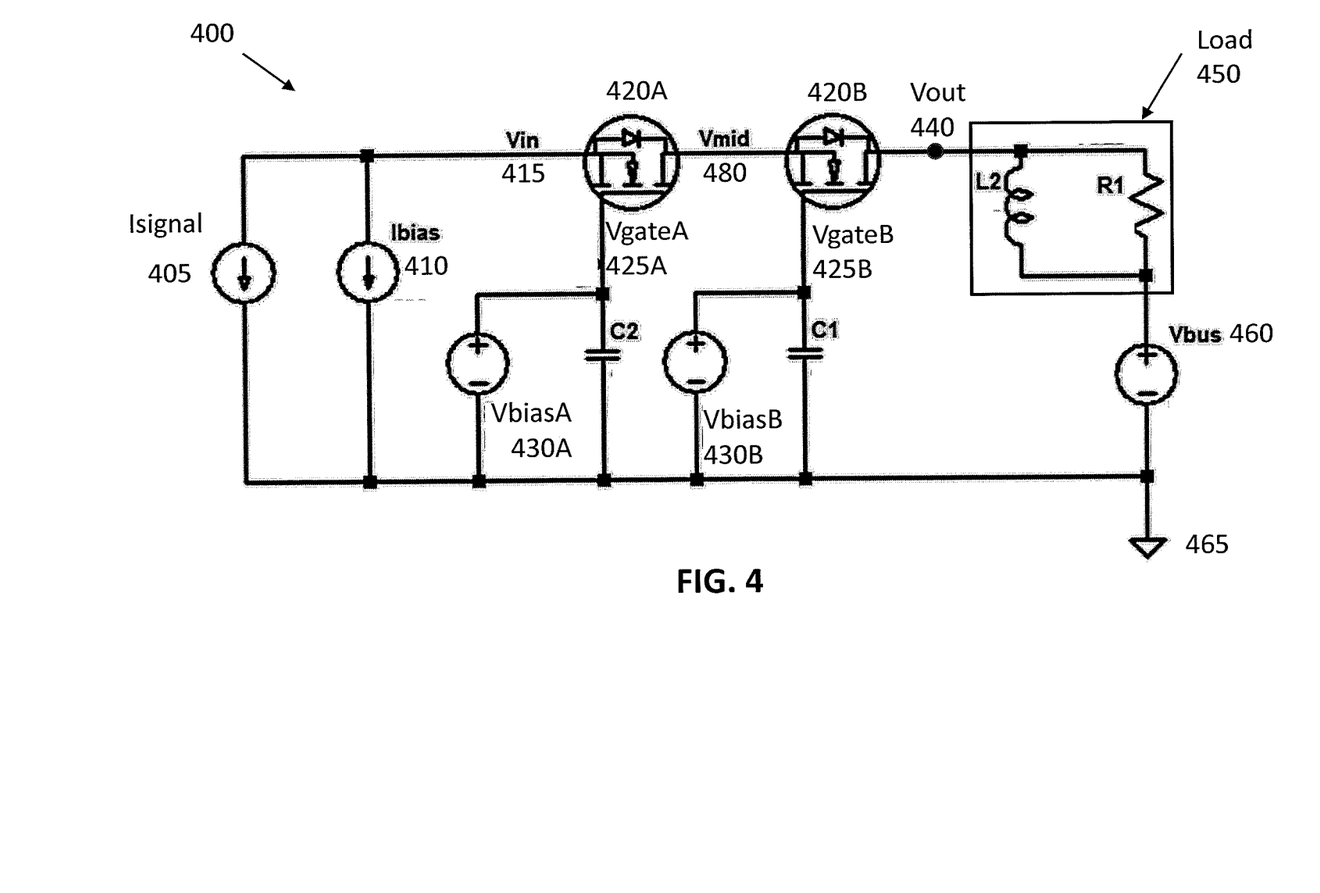
FIG. 4 illustrates a common gate amplifier according to an exemplary embodiment of the present invention, with a second GaN FET transistor to provide a second capacitive voltage divider.

FIG. 4 illustrates a common gate amplifier 400 according to an exemplary embodiment of the present invention. Common gate amplifier 400 is similar to conventional common gate amplifier 100 shown in FIG. 1, and includes an input signal current source 405, a DC biasing current source 410, and a DC bus voltage source 460, as well as a common node 465, and a load 450. However, unlike conventional common gate amplifier 100, common gate amplifier 400 includes two FET transistors: FET transistor 420A and FET transistor 420B. FET transistors 420A and 420B are preferably enhancement mode GaN FETs as shown.

Signal current source 405 and biasing current source 410 are coupled to a source terminal of transistor 420A. The voltage at the source terminal of transistor 420A is labeled Vin 415, and corresponds to the current input to common gate amplifier 400 multiplied by the input impedance. The gate terminal of transistor 420A is coupled to DC bias voltage source 430A and to a capacitor C2, through which the gate terminal of transistor 420A, labeled as VgateA 425A, is connected to AC ground 465. DC bias voltage source 430A provides a DC voltage VbiasA to gate terminal 420A. The drain terminal of transistor 420A is connected to the source terminal of transistor 420B.

The voltage at the drain terminal of transistor 420A and the source terminal of transistor 420B is labeled Vmid 480. The gate terminal of transistor 420B is coupled to bias voltage source 430B and to a capacitor C1, through which the gate terminal of transistor 420B, labeled as VgateB 425B, is connected to AC ground. Bias voltage source 430B provides a DC voltage VbiasB to gate terminal 420B. The drain terminal of transistor 420B is coupled to load 450, which is schematically represented by an inductor L2 and a resistor R1. The voltage on the drain terminal of transistor 420B is labeled Vout 440, and corresponds to the bus voltage Vbus 460 summed with the current output from common gate amplifier 400 multiplied by the load impedance. Because the input current of the common gate amplifier is equal to the output current, Vout 440 corresponds to the input current multiplied by the output impedance.

Common gate amplifier 400 with two GaN transistors 420A and 420B offers substantially the same current and voltage gains as conventional common gate amplifier 100 shown in FIG. 1, but experiences reduced reverse voltage gain Vin/Vout in Vin 415 compared to Vin 115. Transistors 420A and 420B cause voltage transients in Vout 440 to pass through two capacitive voltage dividers: a first voltage divider from the drain to source capacitance of transistor 420A (Cds(A)) and gate to source capacitance of transistor 420A (Cgs(A)); and a second voltage divider from the drain to source capacitance of transistor 420B (Cds(B)) and gate to source capacitance of transistor 420B (Cgs(B)). The relationship between input voltage Vin 415 and output voltage Vout 440 is represented as:

$$Vin = \frac{Cds(A)}{Cgs(A)+Cds(A)}\left(\frac{Cds(B)}{Cgs(B)+Cds(B)}Vout\right)$$

As may be seen in the above representation of the relationship between Vin 415 and Vout 440, the additional transistor causes additional attenuation in the voltage transients between Vout 440 and Vin 415, reducing the risk of damage to other components on the IC.

Because Vmid 480 will not exceed Vbias 430B plus the threshold voltage of transistor 420B, transistor 420A may be a GaN FET with a lower drain-to-source voltage rating, and occupy a smaller surface area of a semiconductor die including the IC with common gate amplifier 400 than GaN transistor 420B. In some embodiments, the low voltage GaN FET transistor 420A may be chosen to have different parasitic capacitances than high voltage GaN FET transistor 420B, and cause greater voltage division than GaN FET transistor 420B, similar to a silicon MOSFET. In some embodiments, VgateA 425A can be generated from VgateB 425B, for example using a resistive voltage divider or active regulator.

Figure 5:
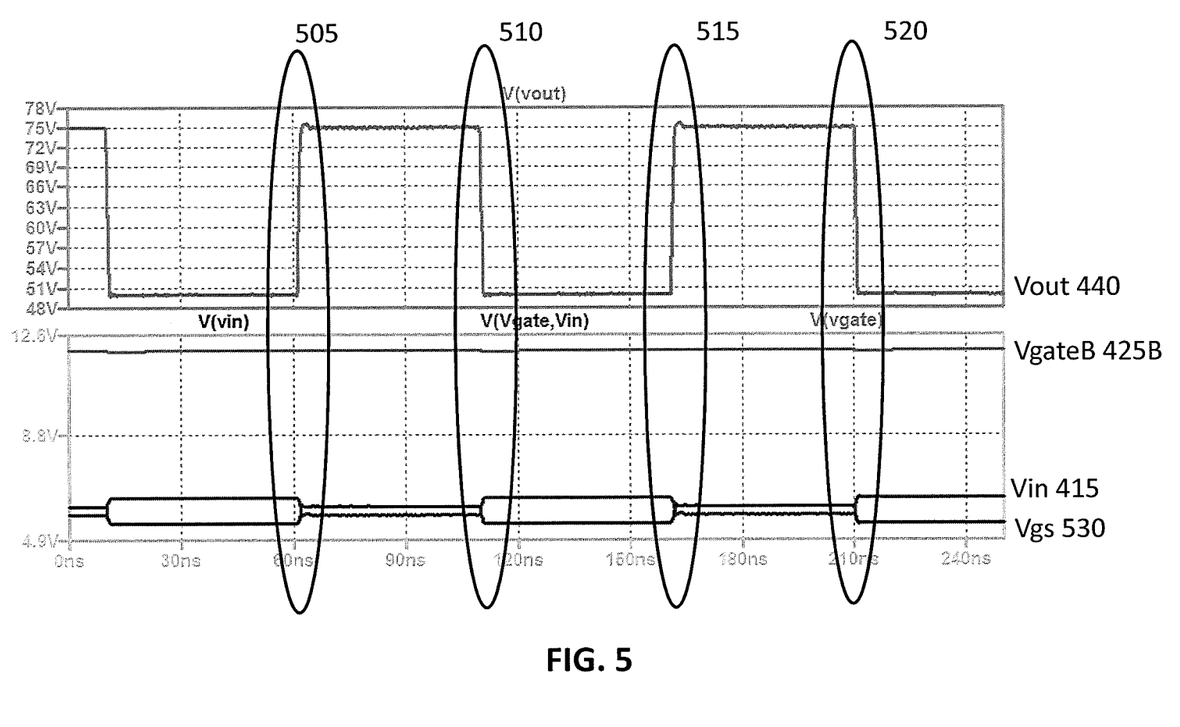
FIG. 5 illustrates a graph of input voltage, gate voltage, and output voltage for the common gate amplifier of FIG. 4.

FIG. 5 illustrates a graph of input voltage Vin 415, gate voltage VgateB 425B, and output voltage Vout 440 for common gate amplifier 400 shown in FIG. 4. As may be seen at 505, 510, 515, and 520, the voltage transient portion of Vout 440 is similar to the voltage transient portion of Vout 140 shown in FIG. 2, but the voltage transients in Vin 415 are much smaller than the voltage transients in Vin 115 shown in FIG. 2. The voltage transients in Vout 440 have been attenuated twice, through the capacitive voltage dividers in both GaN FET transistors 420A and 420B, rather than only once through a single capacitive voltage divider in a single GaN FET transistor 120.

As explained below, in further embodiments of the present invention, both GaN FET transistors 420A and 420B may be integrated on a single chip with a single bias voltage generator, and multiple complete dual-FET common gate amplifiers may be integrated on a single chip.

Figure 6:
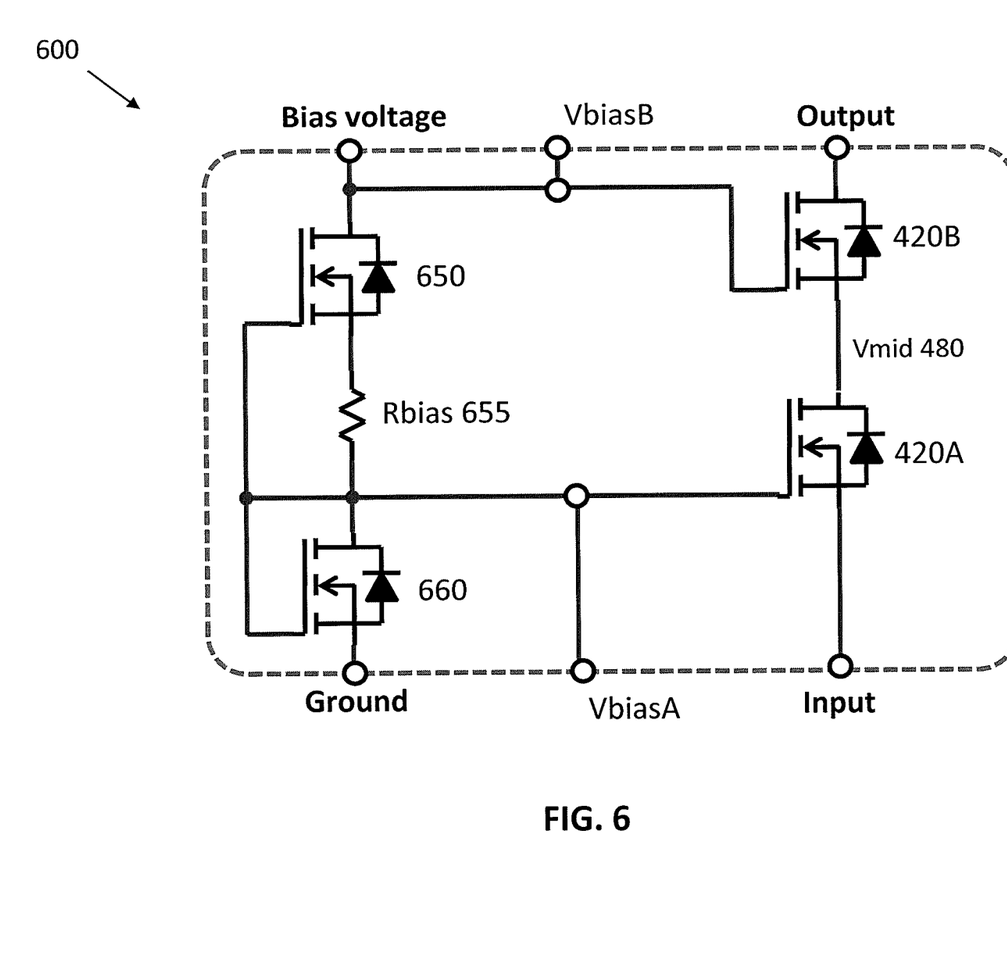
FIG. 6 illustrates an embodiment of the present invention including a common gate amplifier with a single internal bias voltage divider integrated into a monolithic chip.

FIG. 6 illustrates a circuit 600 including internal bias voltage divider circuitry for generating bias voltages VbiasB and VbiasA from a single external bias voltage source. The internal bias voltage divider circuitry includes FET transistors 650 and 660 and a resistor Rbias 655. The value of resistor Rbias 655 sets the value of VbiasA. The larger biasing voltage, VbiasB, is applied to the gate terminal of FET transistor 420B. VbiasA, generated by the internal voltage reference, is applied to the gate terminal of transistor 420A. Bias voltages VbiasB and VbiasA may be provided to external circuits via terminals on the die. Although in this example the bias voltages VbiasB and VbiasA are generated by an internal bias voltage divider circuit integrated on the same die as the associated common gate amplifier, the bias voltages may be generated by any appropriate means, by circuits residing on the same die as the associated common gate amplifier, external to the die, or a combination of the two.

The internal bias voltage divider circuitry of FIG. 6 provides a simplified device for an end user, as it requires only a single biasing voltage input rather than multiple inputs. The value of resistor Rbias 655 is chosen to cause a particular decrease in voltage, such that the voltage difference between VbiasA and VbiasB is greater than the threshold voltage of transistor 420B, and transistor 420B remains on. Transistors 650 and 660 may be chosen to be similar to transistors 420A and 420B, yielding a very stable design. It is contemplated that transistor 420A may be scaled in size relative to transistor 420B.

Figure 7:
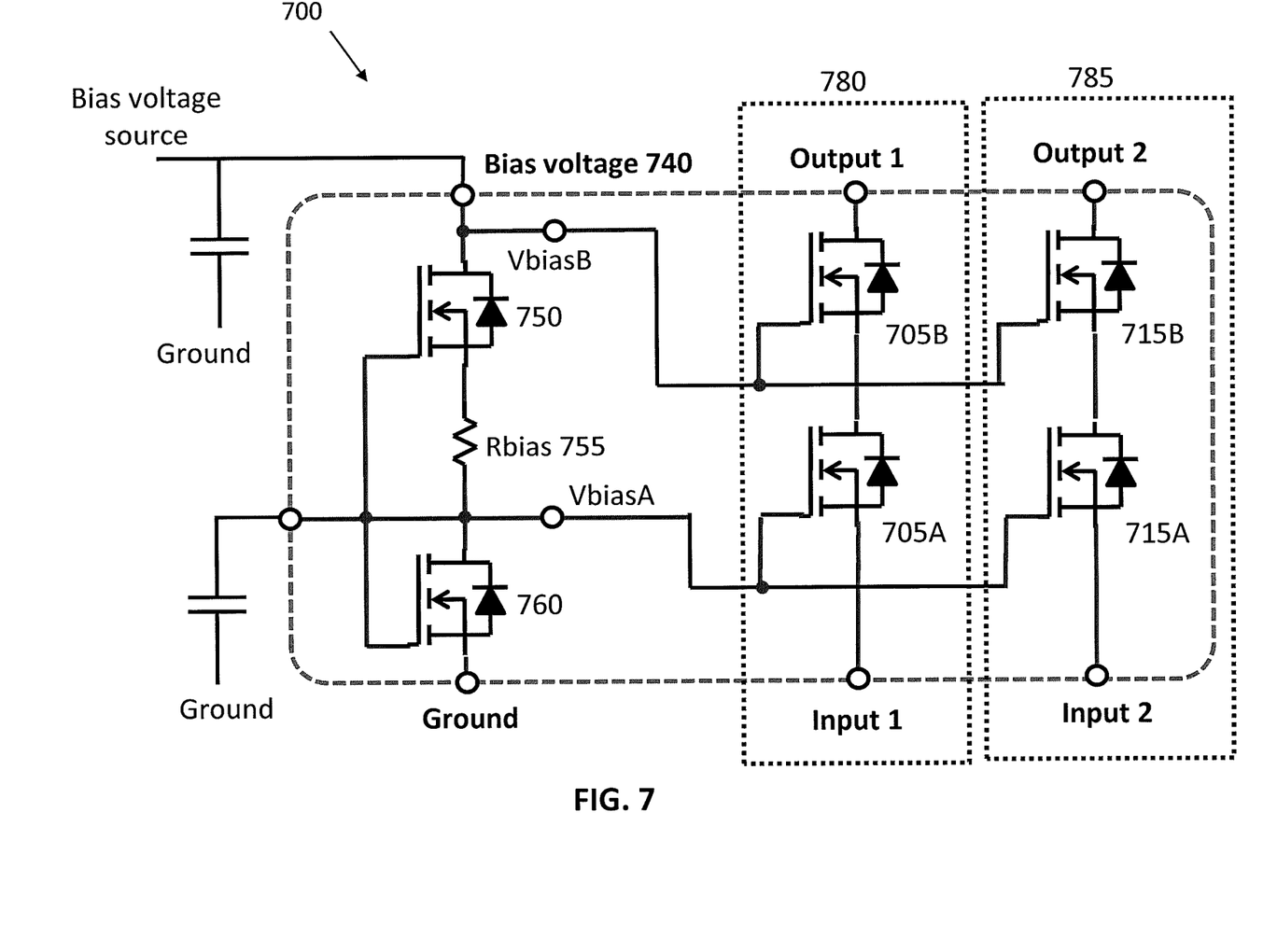
FIG. 7 illustrates an embodiment of the present invention including two common gate amplifiers and a single internal bias voltage divider integrated into a monolithic chip.

As shown in FIG. 7, multiple complete dual-FET common gate amplifiers can be integrated on a single semiconductor die. Circuit 700 of FIG. 7 is similar to circuit 600 of FIG. 6, but includes two common gate amplifiers 780, 785 and a single bias voltage generator, all on one die. More specifically, as shown in FIG. 7, circuit 700 includes a bias voltage generator formed of FET transistors 750 and 760 and resistor Rbias 755 to provide a second gate biasing voltage VbiasA applied to the gates of FET transistors 705A and 715A. This circuit allows multiple common gate amplifiers to be biased by the same internal biasing circuit from a single bias voltage source. Circuit 700 may be particularly useful in implementations with a differential load or differential input. Although in this example a single bias voltage generator provides biasing voltages to both amplifiers in circuit 700, in other implementations each amplifier is associated with a unique bias voltage generator.

Figure 8:
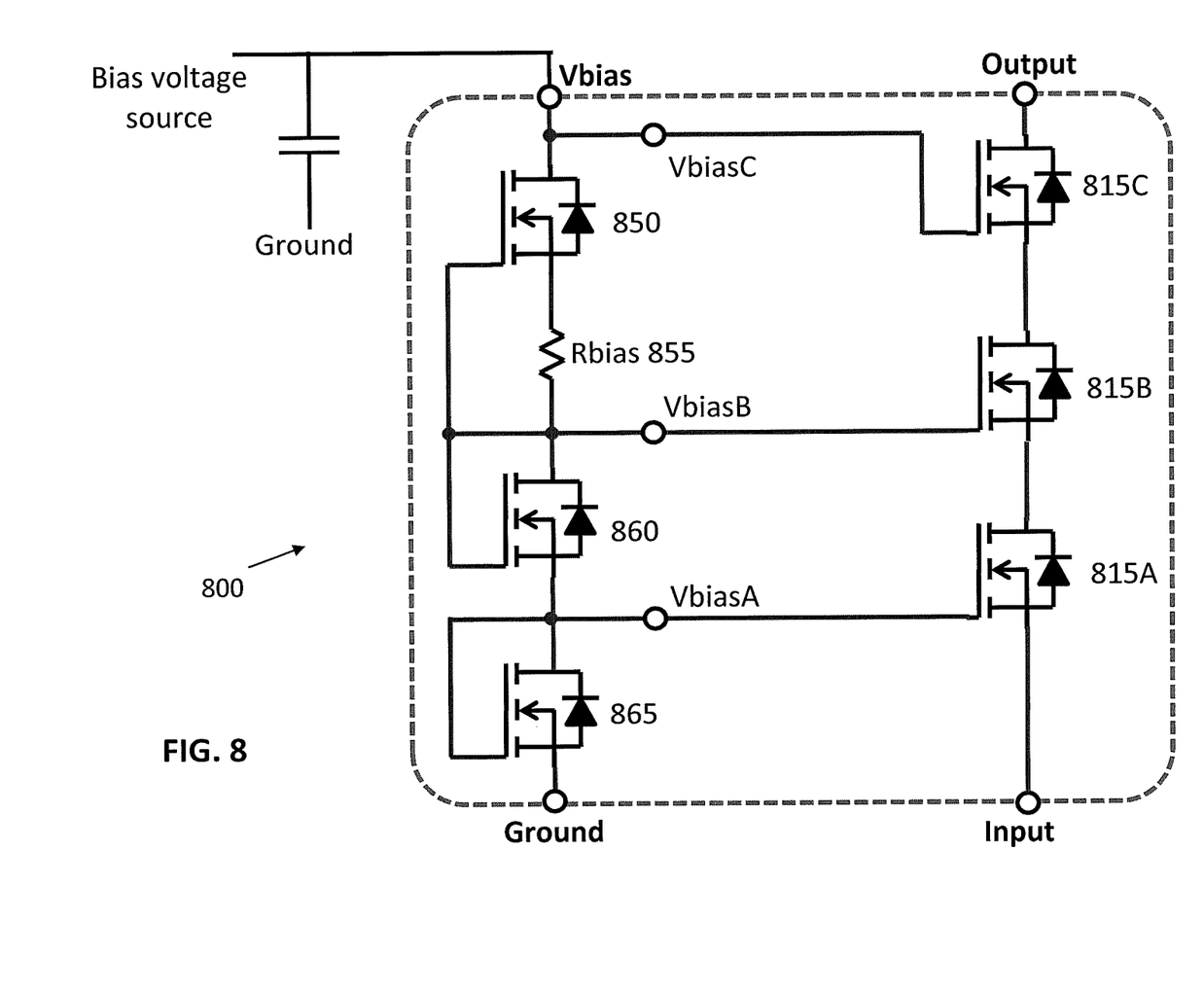
FIG. 8 illustrates an embodiment of the present invention including a third GaN FET transistor connected in series with the two GaN FET transistors of FIG. 4, and with a single internal bias voltage divider for providing three different bias voltages for the three transistors from a single external source.

Although FIGS. 4, 6, and 7 show only two FET transistors connected in series for each common gate amplifier, additional transistors may be connected in series to provide additional capacitive voltage division. FIG. 8 illustrates a circuit 800 including a common gate amplifier with three FET transistors 815A, 815B, and 815C connected in series. Circuit 800 is otherwise similar to circuit 600 shown in FIG. 6, but includes an internal bias voltage divider with three transistors 850, 860, and 865 which, together with resistor Rbias 855, provide three gate biasing voltages, VbiasC, VbiasB, and VbiasA, which are applied to the gates of FET transistors 815C, 815B, and 815A, respectively.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A common gate amplifier, comprising:
    an input for receiving an input signal;
    an output for outputting an output signal to a load;
    a first FET transistor having a gate terminal connected to a first bias voltage, a source terminal connected to the input, and a drain terminal;
    a second FET transistor having a gate terminal connected to a second bias voltage, a source terminal connected to the drain terminal of the first FET transistor, and a drain terminal coupled to the output; and
    a bias voltage divider circuit for providing both the first bias voltage and the second bias voltage from a single voltage source, wherein the bias voltage divider circuit comprises two additional FET transistors and a resistor.

2. The common gate amplifier of claim 1, wherein the first FET transistor is smaller than the second transistor.

3. The common gate amplifier of claim 1, wherein the first and second FET transistors are enhancement mode gallium nitride field effect transistors.

4. The common gate amplifier of claim 1, wherein the bias voltage divider circuit and the first and second FET transistors are integrated on a single semiconductor chip.

5. The common gate amplifier of claim 4, further comprising a second pair of FET transistors having respective gate terminals correspondingly connected to the first and second bias voltages to provide a second common gate amplifier on the single semiconductor chip.

6. The common gate amplifier of claim 1, further comprising a third FET transistor connected in series with the first and second FET transistors, the third FET transistor having a gate terminal connected to a third bias voltage.

* * * * *